(12) United States Patent
Toyoda (10) Patent No.: US 6,175,152 B1
(45) Date of Patent: Jan. 16, 2001

(54) SEMICONDUCTOR DEVICE (75) Inventor: Takeshi Toyoda, Urawa (JP)

(73) Assignee: Citizen Watch Co., Ltd., Tokyo (JP)

( * ) Notice: Under 35 U.S.C. 154(b), the term of this patent shall be extended for 0 days.

(21) Appl. No.: 09/338,803

(22) Filed: Jun. 23, 1999

(30) Foreign Application Priority Data

Jun. 25, 1998 (JP) .................................. 10-178513

(51) Int. Cl.[7] .............................. H01L 23/48; H01L 23/52
(52) U.S. Cl. .......................... 257/690; 257/693; 257/698; 257/689
(58) Field of Search ................................... 257/690, 693, 257/698, 689

(56) References Cited

U.S. PATENT DOCUMENTS

| | | | |
|---|---|---|---|
| 5,583,376 | * 12/1996 | Sickler et al. | 257/702 |
| 5,640,047 | * 6/1997 | Nakashima | 257/738 |
| 5,756,380 | * 5/1998 | Berg et al. | 438/126 |
| 5,798,571 | * 8/1998 | Nakajima | 257/784 |
| 5,825,628 | * 10/1998 | Garbelli et al. | 361/763 |
| 6,060,774 | * 5/2000 | Terui | 257/692 |

FOREIGN PATENT DOCUMENTS 11-260954 * 9/1924 (JP).
8-23665 * 9/1996 (JP).

* cited by examiner

*Primary Examiner*—Sheila V. Clark
*Assistant Examiner*—Jhihan B. Clark
(74) *Attorney, Agent, or Firm*—Armstrong, Westerman, Hattori, McLeland, & Naughton (57) ABSTRACT

A semiconductor device including a die pattern for mounting a semiconductor chip thereon using an adhesive, and connection electrodes connected with each electrode of the semiconductor chip by bonding wires, wherein the die pattern and connection electrodes are provided on one surface of the circuit board, a wiring pattern electrically connected with the die pattern or the connection electrodes by way of through-holes, and a plurality of solder bumps electrically connected with the wiring pattern, wherein the wiring pattern facing the semiconductor chip is formed on substantially an entire surface of a predetermined region which is larger than the outer dimensions of the semiconductor chip and extends to the entire periphery of the semiconductor chip.

2 Claims, 7 Drawing Sheets

SEMICONDUCTOR DEVICE

BACKGROUND OF THE INVENTION

1. Field of the Invention

The invention relates to a surface-mounting type semiconductor device comprising a semiconductor chip mounted on a circuit board by an adhesive and sealed with resin and solder bumps disposed on the back surface of the circuit board.

2. Description of the Related Art

Semiconductor devices having a plurality of electrode terminals have been developed and are associated with high-performance electronic circuits. As such a semiconductor device, there is a typically exemplified surface-mounting type package having a plurality of terminals, and the package is known as a plastic ball grid array (hereinafter referred to as PBGA). Since the external terminals of the PBGA can be disposed at the entire back surface of a package, it has a characteristic such that it is suitable for a multi-pin type LSI and has a small packaging area.

Figure 8:
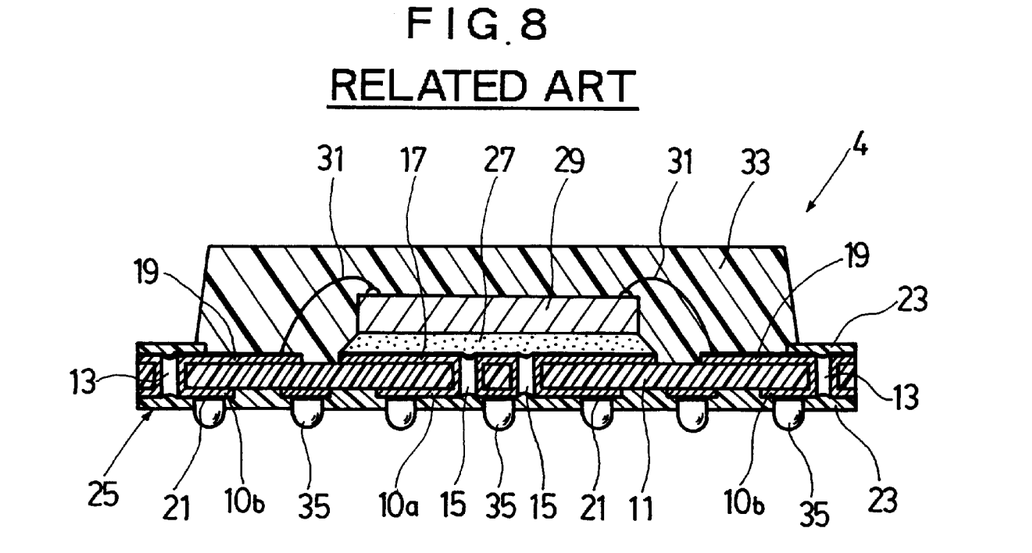
FIG. 8 is a sectional view of a conventional semiconductor device like FIG. 1.
Figure 9:
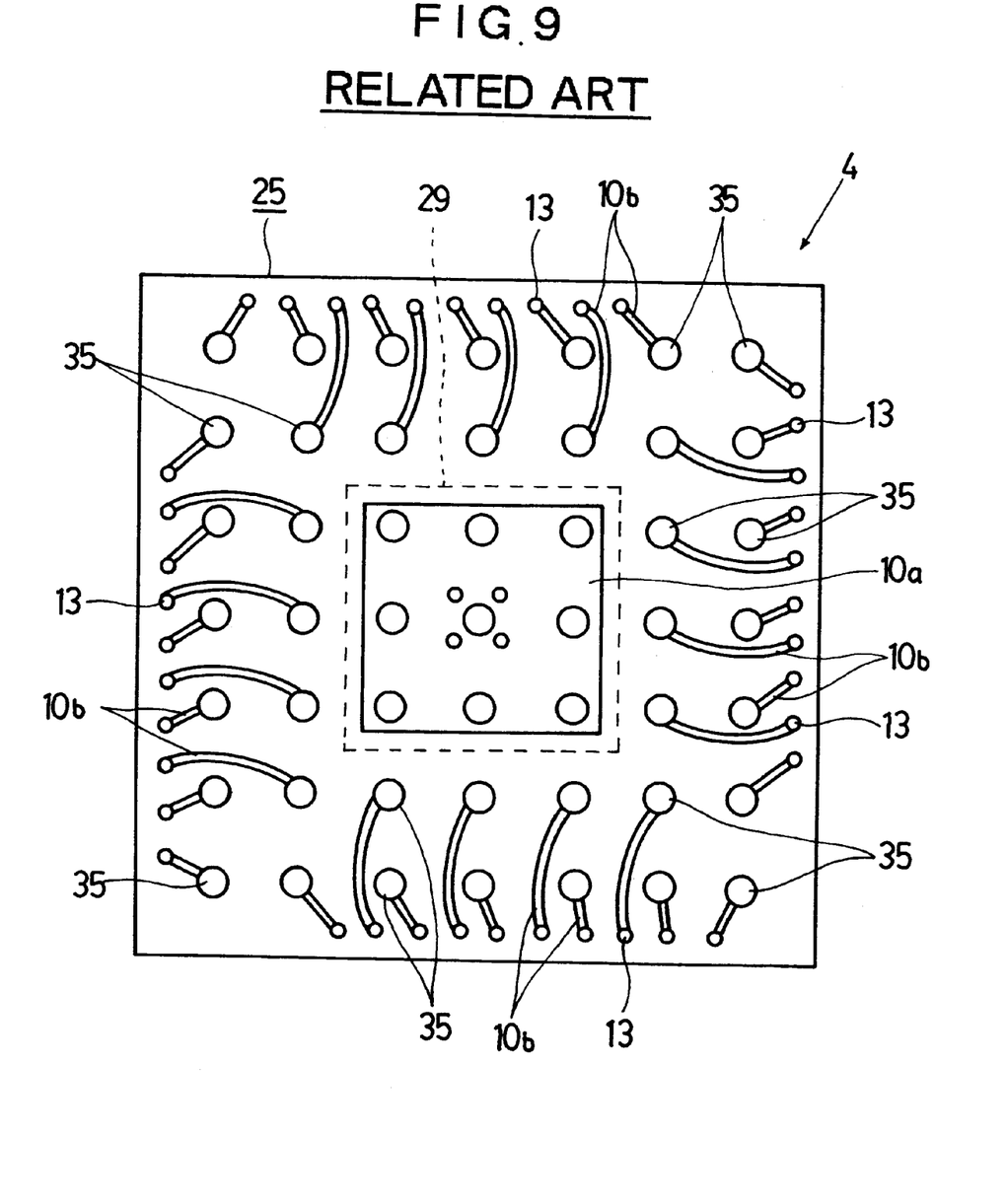
FIG. 9 is a rear view of the conventional semiconductor device.

An example of a conventional PBGA is explained with reference to FIGS. 8 and 9. FIG. 8 is a sectional view of the PBGA and FIG. 9 is a rear view of the PBGA.

A PBGA 4 is fabricated by forming a die pattern 17 on a front surface of a circuit board 25 on which a semiconductor chip 29 is mounted (hereinafter referred to as front surface), fixing the semiconductor chip 29 onto the die pattern 17 by an adhesive 27, providing a plurality of solder bumps 35 on the back surface of the circuit board 25, and sealing a major portion thereof including the semiconductor chip 29 on the front surface and bonding wires 31, described later, with a sealing resin 33 formed of a thermosetting resin such as in epoxy resin.

The circuit board 25 comprises a resin substrate 11 formed of Bismaleimide Triazine Resin, a copper foil covering the front and back surfaces of the resin substrate 11 that is in the order of 18 μm in thickness, and a copper-plated layer formed on the copper foil, wherein the copper foil and the copper-plated layer are etched to form the die pattern 17 and connection electrodes 19 on the front surface of the resin substrate 11 and a wiring pattern formed on the back surface of the resin substrate 11 and composed of a common wiring pattern 10a and individual wiring patterns 10b.

The die pattern 17 is formed radially on the center of the front surface of the resin substrate 11 and the semiconductor chip 29 is mounted on the die pattern 17 using the adhesive 27, and it serves as a power supply ground of the semiconductor chip 29 and serves to radiate generated heat.

An epoxy conductive adhesive using silver as a filter (additive) is used as the adhesive 27. The conductive adhesive is used for ensuring an electric conduction with an external ground from the back surface of the semiconductor chip 29 through the die pattern 17, through the holes for heat radiation (described later) the common wiring pattern 10a, pad electrodes 21 and the solder bumps 35.

A large number of connection electrodes 19 are formed radially outside the die pattern 17 so as to surround the die pattern 17, and they are connected with respective electrodes of the semiconductor chip 29 by the bonding wires 31. Gold wires each having the diameter of about 0.03 mm and being excellent in electric characteristic and excellent in contact with the connection electrodes 19 are used at the bonding wires 31.

The through-holes 15 for heat radiation are provided on a region where the die pattern 17 of the circuit board 25 is formed. The through-holes 15 are plated with copper at the inner peripheral surfaces for electrically connecting the die pattern 17 and the common wiring pattern 10a situated on the back surface of the circuit board 25 and they serve to radiate heat generated in the semiconductor chip 29.

Through-holes 13 which are plated with copper at the inner peripheral surfaces thereof are also situated at the outer ends of the connection electrodes 19 close to a peripheral edge of the circuit board 25. Each connection electrode 19 on the front surface of the circuit board 25 and each individual wiring pattern 10b on the back surface thereof are electrically connected with one another by these through-holes 13.

As shown in FIG. 9, the common wiring pattern 10a formed on the back surface of the circuit board 25 is formed in various pattern shapes (square in this embodiment) at the center facing the back surface of the semiconductor chip 29 and it extends to an area which has a plurality of solder bumps 35 used for grounding.

A large number of individual wiring patterns 10b are formed at the periphery of the common wiring pattern 10a for individually connecting each through-hole 13 which is formed along each side of the circuit board 25 and each solder bump 35 (excluding nine solder bumps on the common wiring pattern 10a).

Pad electrodes 21 are formed at the positions where the solder bumps 35 are fixed to the common wiring pattern 10a and the individual wiring patterns 10b, and the solder bumps 35 are arranged in line on the pad electrodes. The plurality of solder bumps 35 protrude from the back surface of the PBGA 4 instead of each electrode of the semiconductor chip 29 and serve as connection terminals for electrically connecting with an electrode pattern of a mother board on which the PBGA 4 is mounted. A solder consisting of tin and lead at a mixture ratio of 6 to 4 is used as each solder bump 35.

The PBGA 4 is covered with a protecting resist 23 formed of a modified epoxy resin at the entire surface thereof except a part covered with the sealing resin 33 of the circuit board 25 and a part forming each pad electrode 21 on the back surface of the circuit board 25. FIG. 9 shows the back surface of the PBGA 4 with the protecting resist 23 removed.

Although the PBGA 4 having such a construction has an advantage of high yield because it can be mounted on the surface of a circuit board and can cope with multi-pins without miniaturizing pitches of the solder bumps, and also it can be mounted by the process of a single heating, the PBGA 4 has the following problems in its construction.

The PBGA generally absorbs moisture contained in the ambient atmosphere through the circuit board 25 and the sealing resin 33 shown in FIG. 8 during the storage thereof Accordingly, if the PBGA 4 which absorbed the moisture is heated in a heating furnace to mount the PBGA 4 on the mother board, the moisture absorbed by the PBGA 4 is vaporized and expanded to produce stress. Exfoliation occurs at the interface between the die pattern 17 and the adhesive 27 to generate a gap 28.

The reason why such an exfoliation occurs is described in more detail. The amount of moisture absorbed by the PBGA 4 from the back surface of the circuit board 25 at the side of the solder bumps solder bumps 35 is larger than that from the front surface thereof covered with the sealing resin 33, and particularly the amount of moisture absorbed by the PBGA 4 from the periphery of the common wiring pattern 10a which is smaller than the size of back surface of the semiconductor chip 29 is larger than that from the back surface thereof. The moisture absorbed by the PBGA 4 passes through the protecting resist 23 and the through-holes 15, and it is liable to stay at the portion close to the die pattern 17.

Meanwhile, although the die pattern 17 is plated with gold at the surface thereof for enhancing conductivity relative to the semiconductor chip 29 to be mounted thereon and for preventing corrosion thereof, there is a problem that gold is weak in adhesion with an epoxy resin which is a major component of the adhesive 27 and gold is an inert metal. Accordingly, even if the semiconductor chip 29 is bonded to the die pattern 17 by the adhesive 27, the former is liable to exfoliate from the latter because of the weak adhesion.

Accordingly, when the water built up in the portion close to the die pattern 17 is heated by a heating furnace, and vaporized and expanded to produce stress, the effects thereof appear noticeably on the interface between the die pattern 17 and the adhesive 27, so that exfoliation is liable to occur.

Figure 10:
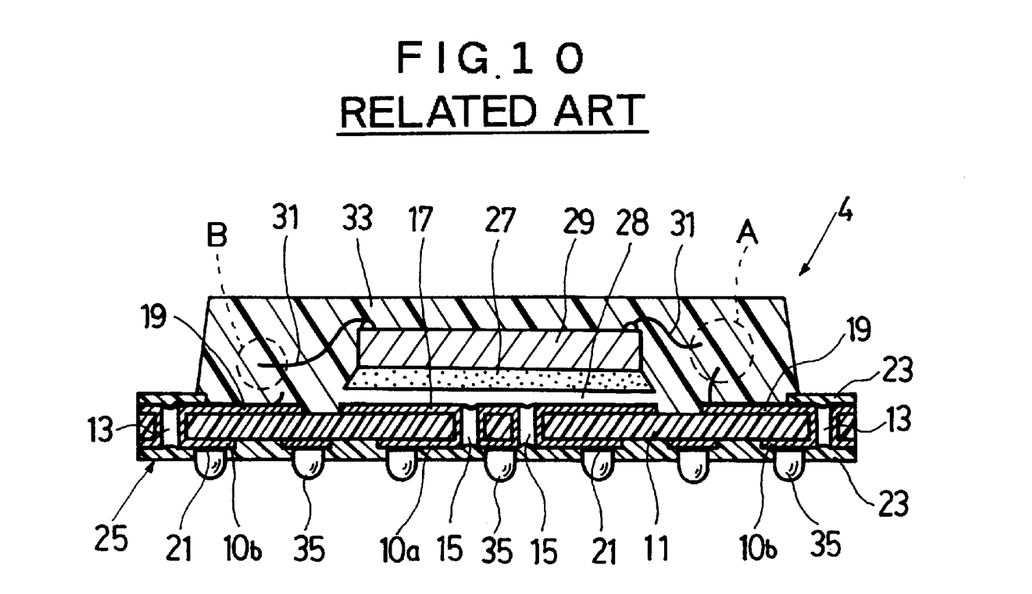
FIG. 10 is a sectional view of the conventional semiconductor device for explaining problems thereof.

Owing to this exfoliation, the bonding wires 31 which are encircled by the broken lines A, B in FIG. 10 are broken and they are exfoliated from the connection electrodes, causing the problem of degradation of reliability of the semiconductor device.

SUMMARY OF THE INVENTION

The invention has been made for solving the foregoing problems of the conventional PBGA type semiconductor device and it is an object of the invention to enhance the reliability of a semiconductor device by preventing a semiconductor chip from exfoliating from a die pattern due to heating when mounting a semiconductor chip to a mother board such that bonding wires are not cut and they are not exfoliated from connection electrodes.

To achieve the above object, the invention is constructed as follows in a semiconductor device including a semiconductor chip which is mounted on a circuit board by an adhesive and sealed by a resin.

Provided on one surface of the circuit board is a die pattern for mounting the semiconductor chip thereon using the adhesive, and a plurality of connection electrodes connected with each electrode of the semiconductor chip by bonding wires, and provided on the other surface of the circuit board is a wiring pattern electrically connected with the die pattern or the connection electrodes by way of through-holes, a plurality of pad electrodes provided on the wiring pattern, and a plurality of solder bumps electrically connected with the wiring pattern by way of the pad electrodes.

A portion of the wiring pattern provided on the other surface of the circuit board and facing the semiconductor chip is formed on substantially an entire surface of a predetermined region which is larger than outer dimensions of the semiconductor chip and extends to the entire periphery of the semiconductor chip.

With such a construction, when moisture permeates the inside of the semiconductor chip from the back surface of the circuit board, the moisture can be effectively prevented from permeating the periphery of the semiconductor chip by the wiring pattern formed on substantially the entire surface of the region which is larger than the outer dimensions of the semiconductor chip and extends to the entire periphery of the semiconductor chip. Accordingly, it is possible to noticeably restrain water from building up in the portion close to the die pattern, thereby remarkably reducing the production of stress owing to the vaporization and expansion of water caused by heating, resulting in prevention of exfoliation between the semiconductor chip and die pattern.

Further, the portion of the foregoing wiring pattern facing the back surface of the semiconductor chip may be formed by dividing a plurality of portions which are electrically insulated from one another by small gaps. With such a construction, a wiring pattern for other signals as well as the common wiring pattern for a power supply earth can be formed on the back surface of the circuit board at the portion facing the back surface of the semiconductor chip, resulting in effectively restraining moisture from permeating a portion close to the die pattern.

The above and other objects, features and advantages of the invention will be apparent from the following detailed description which is to be read in conjunction with the accompanying drawings.

DETAILED DESCRIPTION OF THE PREFERRED EMBODIMENTS

Figure 1:
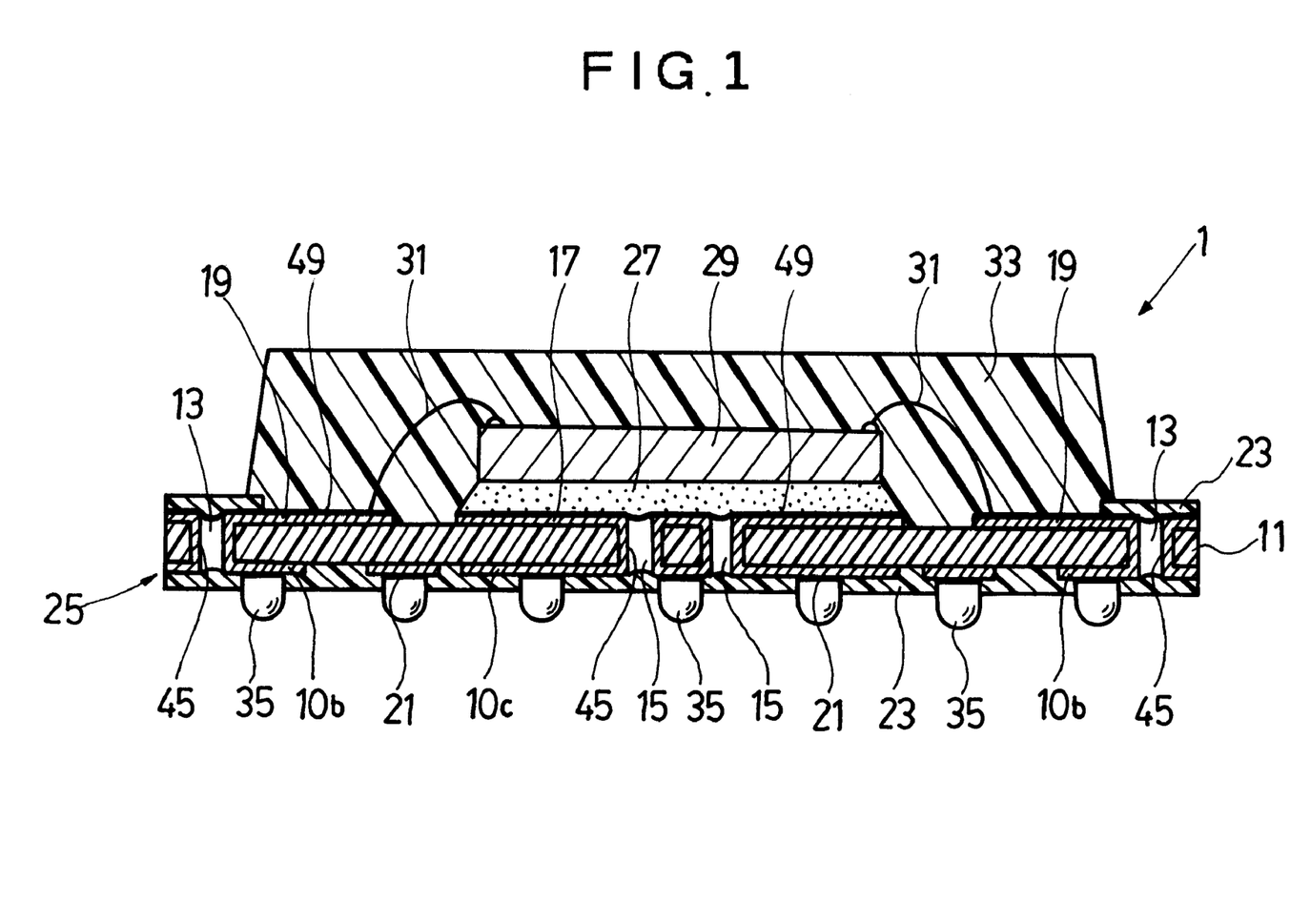
FIG. 1 is a sectional view of a semiconductor device taken along the line A—A in FIG. 2 according to a first embodiment of the invention.
Figure 2:
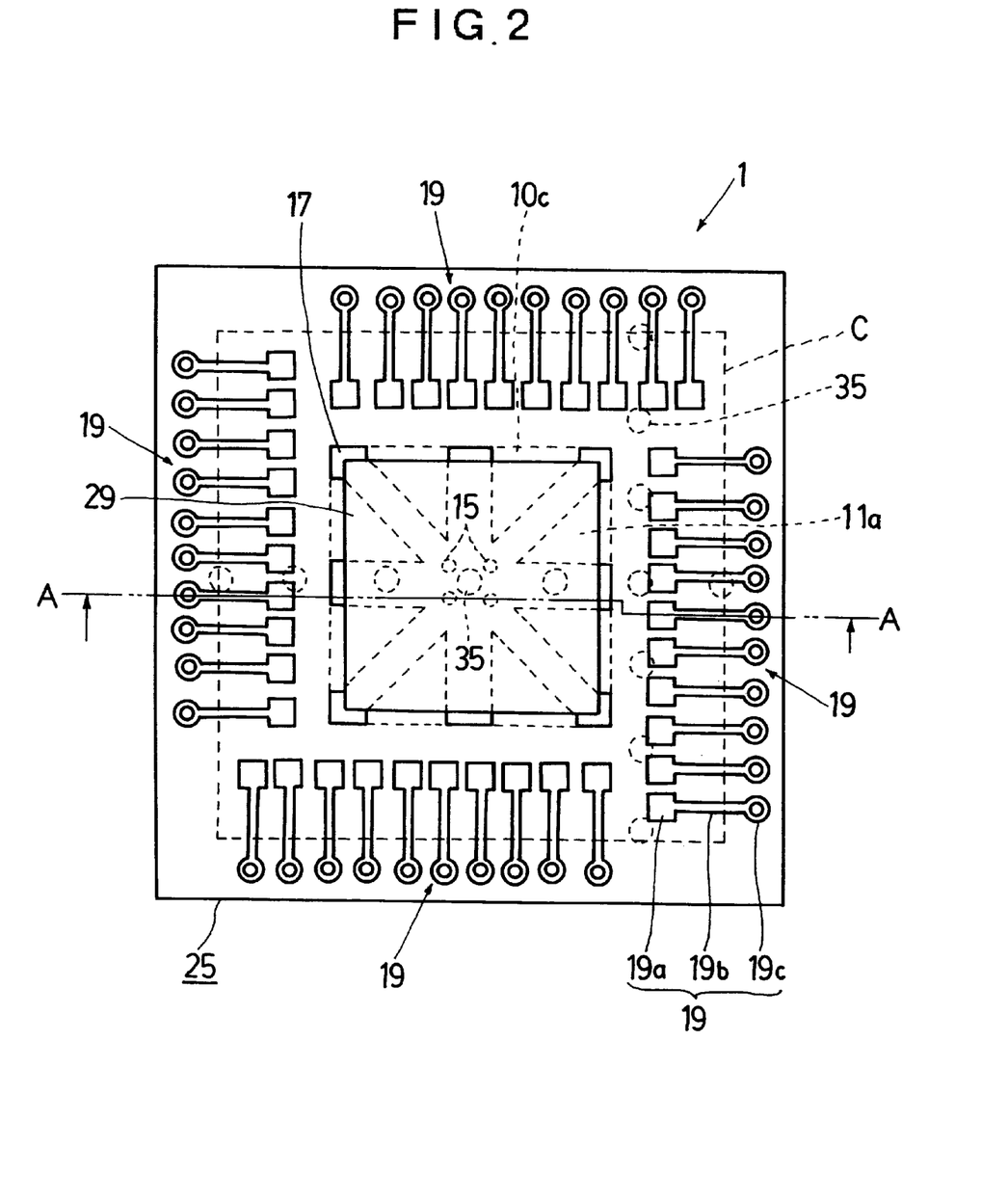
FIG. 2 is a plan view of the semiconductor device in FIG. 1.
Figure 3:
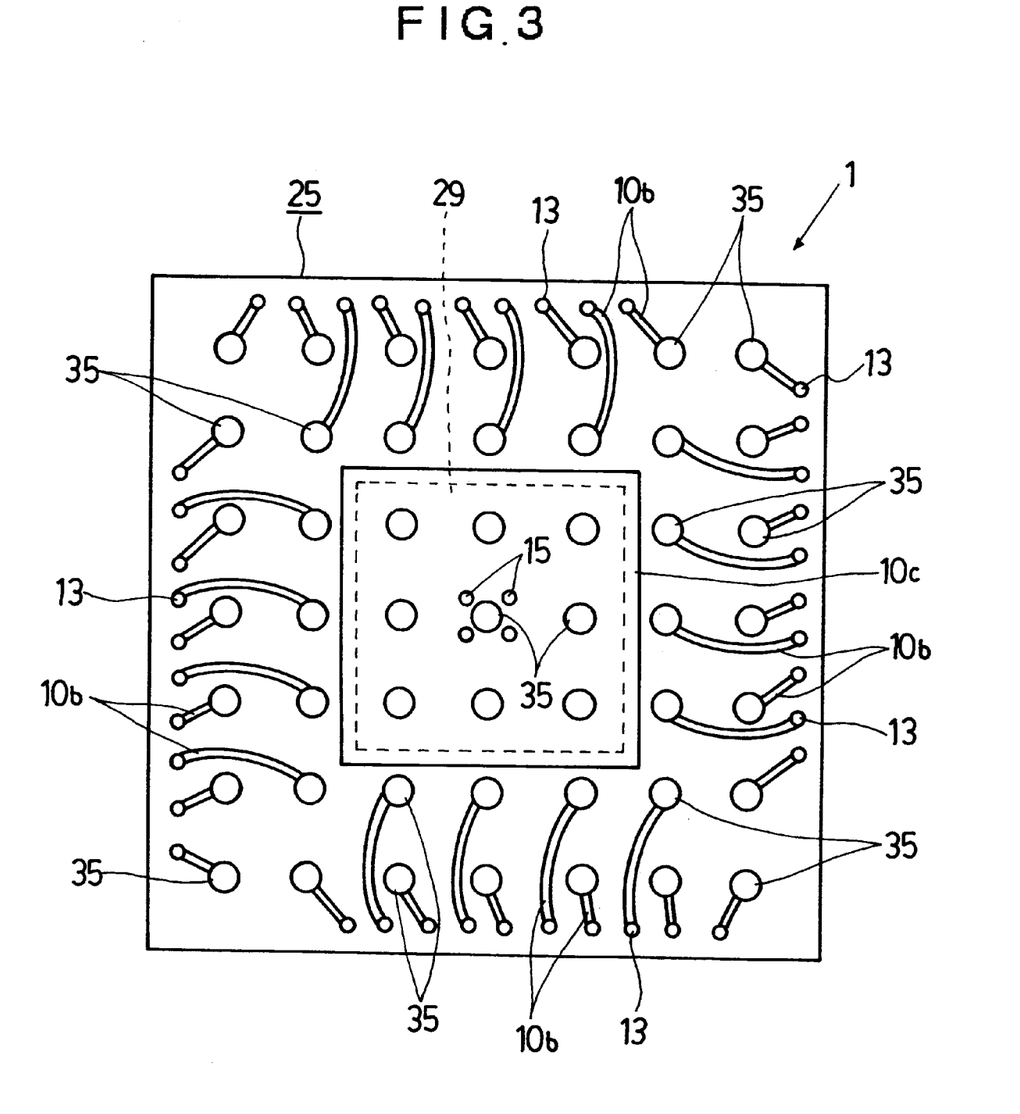
FIG. 3 is a rear view of the semiconductor device in FIG. 1.

A semiconductor device according to a first embodiment of the invention is now described with reference to the drawings. FIG. 1 is a sectional view of a PBGA showing a first embodiment of the invention of the semiconductor device taken along the line A—A in FIG. 2, FIG. 2 is a plan view of the same, and FIG. 3 is a rear view of the same. In these figures, components corresponding to those in FIGS. 8 and 9 are depicted by the same reference numerals.

The construction of the PBGA that is the first embodiment of the invention of the semiconductor device is first described with reference to these figures.

A PBGA 1 comprises a circuit board 25, a die pattern 17 formed on a surface (front surface) of the circuit board 25 on which a semiconductor chip 29 is mounted wherein the semiconductor chip 29 is fixed onto the die pattern 17 by a conductive adhesive 27, a plurality of solder bumps 35 provided on the back surface of the circuit board 25, and the major portion of the front surface including the semiconductor chip 29 and the bonding wires 31 is sealed by a sealing resin 33. A thermal-setting resin such an epoxy resin is used as the sealing resin. The sealing resin 33 is omitted in FIG. 2 for the convenience of the same figure but its sealing area is shown by a broken line C.

The circuit board 25 comprises a resin substrate 11, a copper foil covering the front and back surfaces of the resin substrate 11 that is in the order of 18 μm in thickness, and a copper-plated layer formed on the copper foil, wherein the copper foil and the copper-plated layer are etched to form a die pattern 17 and connection electrodes 19 on the front surface of the resin substrate 11 and to form on the back surface of the resin substrate 11 a wiring pattern composed of a common wiring pattern 10c and individual wiring patterns 10b.

The resin substrate 11 is a board member in the order of 0.2 mm to 0.4 mm in thickness having a rectangular shape as viewed from the top and it is made of Bismaleimide Triazine Resin, for example, CCL-H832 (a product name of Mitsubishi Gas Chemical Kabushiki Kaisha) which is a laminated plate coated with copper on a glass cloth substrate.

The die pattern 17 is formed radially on the center of the front surface of the resin substrate 11 in a shape which can be described as a combination of a cross and X. The die pattern 17 is a pattern on which the semiconductor chip 29 is mounted using the adhesive 27 and has a function serving as a power supply ground of the semiconductor chip 29 and a function to radiate heat generated in the semiconductor chip 29 through through-holes 15.

A large number of connection electrodes 19 are formed (by 10 pieces along each side of the circuit board 25 in FIG. 2), in parallel with one another in a direction from portions close to peripheral edges of the respective sides of the circuit board 25 toward the inside of the circuit board 25 so as to surround the die pattern 17. Each of the connection electrodes 19 comprises a square connection terminal portion 19a formed at the inner portion thereof, a circular through-hole forming portion 19c formed at the outer portion thereof, and a belt shaped portion 19b connecting between the square connection terminal portion 19a and circular through-hole forming portion 19c, whereby each electrode of the semiconductor chip 29, not shown, and the square connection terminal portion 19a of each connection electrode 19 are connected with each other by each bonding wire 31 shown in FIG. 1 (each bonding wire 31 is omitted in FIG. 2 for the convenience of the illustration thereof).

Gold-plated layers 49 are formed on the front surface of each connection electrode 19 by a gold plating process. The gold-plated layer 49 is formed to prevent the front surface of each connection electrode 19 on which the gold-plated layer 49 is formed from being corroded, and to enhance the electrical connection between itself and the semiconductor chip 29. However, gold is an inert metal and is very weak in adhesion with epoxy resin which is a major ingredient of the adhesive 27 used for bonding to the semiconductor chip 29. Accordingly, when the die pattern 17 is shaped as shown in FIG. 2, there is provided an exposure portion 11a of the resin substrate 11 to enhance the adhesion between the adhesive 27 for bonding to the back surface of the semiconductor chip 29 and the resin substrate 11.

In the circuit board 25, four through-holes 15 are provided at substantially the center of the circuit board 25 at the portion where the die pattern 17 is formed. Each through-hole 15 is in the order of 0.3 mm in diameter and communicates with the front and back surfaces of the circuit board 25, and a copper-plated layer 45 which is continuous with the die pattern 17 is formed at the inner peripheral surface of each through-hole 15 by a copper plating process. The die pattern 17 on the front surface of the resin substrate 11 is electrically connected with the common wiring pattern 10c formed on the back surface of the resin substrate 11 by the copper-plated layer 45.

Since each through-hole 15 has a function to radiate heat generated in the semiconductor chip 29, they are situated at the portion where the die pattern 17 on which the semiconductor chip 29 is mounted is situated.

Further, there is provided a through-hole 13 at the portion where the circular through-hole forming portion 19c of each connection electrode 19 is formed. Each through-hole 13 is in the order of 0.3 mm in diameter and has the copper-plated layer 45 at the inner peripheral surface in the same way as each through-hole 15. Each connection electrode 19 formed on the front surface of the resin substrate 11 is connected with each individual wiring pattern 10b formed on the back surface thereof by the copper-plated layer 45.

An epoxy conductive adhesive using silver as additives is used as the adhesive 27. The layer on which the semiconductor chip 29 is bonded using the adhesive 27 is in the order of 60 μm in thickness. The conductive adhesive is used as the adhesive 27 for ensuring an electric connection with an external ground from the back surface of the semiconductor chip 29 through the die pattern 17, the through-holes 15, the pad electrodes 21 (described later) and the solder bumps 35.

The wiring pattern formed on the back surface of the circuit board 25 is composed of the common wiring pattern 10c formed at the center thereof and a plurality of individual wiring patterns 10b linearly formed at the periphery thereof.

When the semiconductor chip 29 is mounted on the circuit board 25, the common wiring pattern 10c is formed square or rectangular and positioned in the portion facing the semiconductor chip 29 and the common wiring pattern 10c extends to the entire periphery of the semiconductor chip 29 and it is formed on the entire surface of a predetermined region of the back surface of the circuit board 25 which is larger than the outer dimensions of the semiconductor chip 29. Accordingly, the outer peripheral portion of the common wiring pattern 10c extends to the outside of a position corresponding to the outer periphery of the semiconductor chip 29.

The common wiring pattern 10c serves to connect the perspective solder bumps 35 (nine in FIG. 3) disposed thereon with a common external ground, and also serves to radiate heat and shuts off moisture which may enter the peripheral portion of the semiconductor chip 29 from the outside.

Each individual wiring pattern 10b is connected with the through-hole 13 at one end and connected with each solder bump 35 by way of the pad electrode 21, thereby connecting each connection electrode 19 formed on the front surface of the resin substrate resin substrate 11 with each solder bump 35 (excluding those within the common wiring pattern 10c) formed on the back surface thereof one by one.

Each pad electrode 21 is a thin film electrode formed on the portion where each solder bump 35 provided on each individual wiring patterns 10b and the common wiring pattern 10c are formed, and it has a triple layered construction (detail of which is described later) composed of a copper-plated layer in the order of 12 to 22 μm in thickness, a nickel-plated layer in the order of 5 to 15 μm in thickness and a gold-plated layer in the order of 0.3 to 0.7 μm in thickness in the ascending order. The formation of the pad electrodes 21 ensures the electrical connection between the solder bumps 35 and the individual wiring patterns 10b or common wiring pattern 10c respectively provided thereon.

Each solder bump 35 serves as a connection terminal which protrudes from the back surface of the PBGA 1 toward the outside thereof instead of each electrode of the semiconductor chip 29. That is, each electrode of the semiconductor chip 29 is connected with an electrode pattern of a mother board on which the PBGA 1 is mounted by way of the bonding wires 31, the connection electrodes 19, the through-holes 13 and the pad electrodes 21, so that each solder bump 35 serves as a connection terminal for securing input and output of signals between each electrode of the semiconductor chip 29 and the electrode pattern of the mother board.

When the PBGA 1 is mounted on the mother board, not shown, the PBGA 1 and the mother board are electrically connected with each other by each solder bump 35. A solder consisting of tin and lead at a mixture ratio of 6 to 4, is used for the solder bumps 35.

Excluding the die pattern 17 and the inner portions of the connection electrodes 19 provided on the front surface thereof, and the solder bumps 35 formed on the back surface thereof, the circuit board 25 is covered with the protecting resist 23. However, in the convenience of illustration, the protecting resist 23 is omitted in FIGS. 2 and 3. As the protecting resist 23, it is possible to use alkaline-developing type solder resist of liquid denaturalized epoxy resin, for example, PSR (name of product of Taiyo Ink Manufacturing Corporation).

Each electrode of the semiconductor chip 29 and the connection terminal portion 19a of each connection electrode 19 are electrically connected with each other by the bonding wires 31 on the front surface of the circuit board 25. A gold wire in the order of 0.03 mm in diameter is used as each bonding wire 31, because gold is large in extensibility and difficult to break, and it is inert and stable, and it is neither corroded nor oxidized in the atmosphere, and hence it will easily form a true sphere and is excellent in productivity.

The semiconductor chip 29 and the bonding wires 31 are sealed with the sealing resin 33 for shielding and protecting both the semiconductor chip 29 and the bonding wires 31. A thermal-setting type epoxy resin is used as the sealing resin 33.

As mentioned above, the die pattern 17 is commonly connected with nine solder bumps 35 provided at the center thereof by way of the through-holes 15, the common wiring pattern 10c and the pad electrodes 21, and each connection electrode 19 is individually connected with the other solder bumps 35 by way of the through-holes 13, the individual wiring patterns 10b and the pad electrodes 21.

Since the semiconductor chip 29 is connected with the connection electrodes 19 by each bonding wire 31, it is connected with each solder bump 35 by way of the connection electrodes 19.

Since the PBGA 1 has the construction as set forth above, the following operations and effects are produced by the common wiring pattern 10c formed on the back surface thereof.

That is, since the common wiring pattern 10c is formed on the back surface of the circuit board 25 facing the semiconductor chip 29 on the entire surface of a square or rectangular region which is larger than the outer dimensions of the semiconductor chip and which extends to the entire periphery thereof, in the case when moisture contained in the atmosphere permeates the back surface of the circuit board 25, the permeation thereof is effectively prevented by the common wiring pattern 10c formed of a copper foil and copper-plated layer at the back surface and the portion close to the outer peripheral portion of the semiconductor chip 29 where the concerned die pattern 17 is formed.

Accordingly, the build-up of water in the region where the die pattern 17 is formed can be remarkably reduced. Accordingly, even if the PBGA 1 is heated when it is mounted on the mother board, exfoliation of the semiconductor chip 29 from the die pattern 17 does not occur, the bonding wires 31 are neither cut nor exfoliated from the connection electrodes 19, thereby enhancing a reliability of the semiconductor device.

Figure 4:
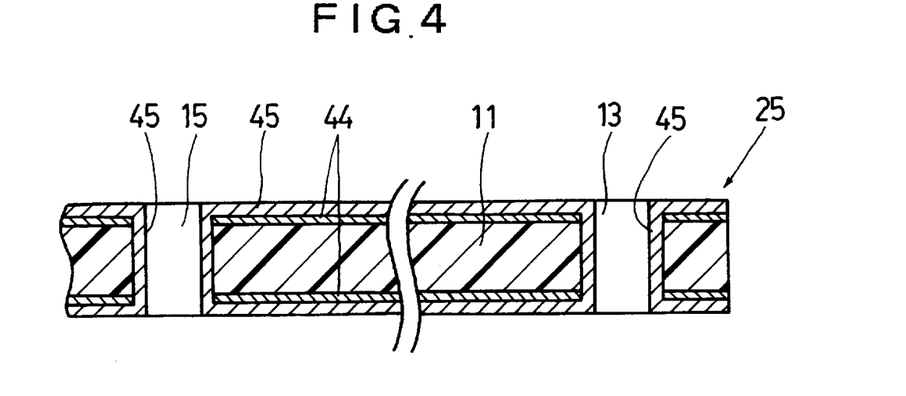
FIG. 4 is a sectional view of a circuit board of the semiconductor device a major part thereof is broken for explaining a first process of fabricating the circuit board of the semiconductor device.
Figure 5:
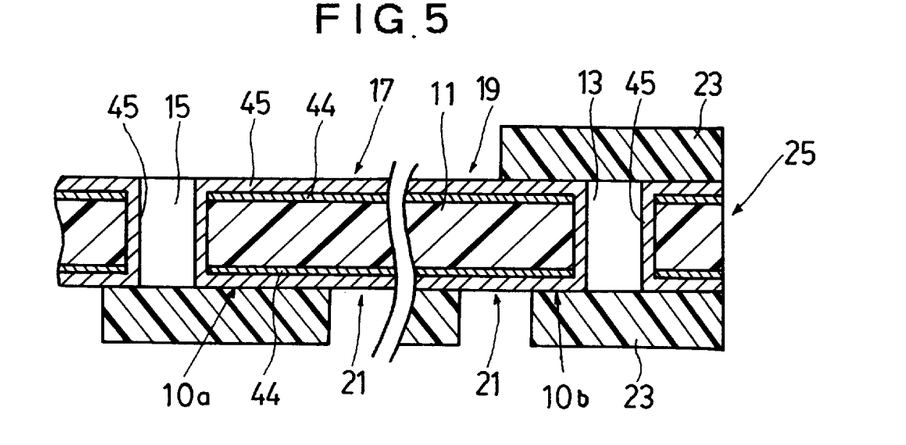
FIG. 5 is a sectional view of the circuit board for explaining a second process.
Figure 6:
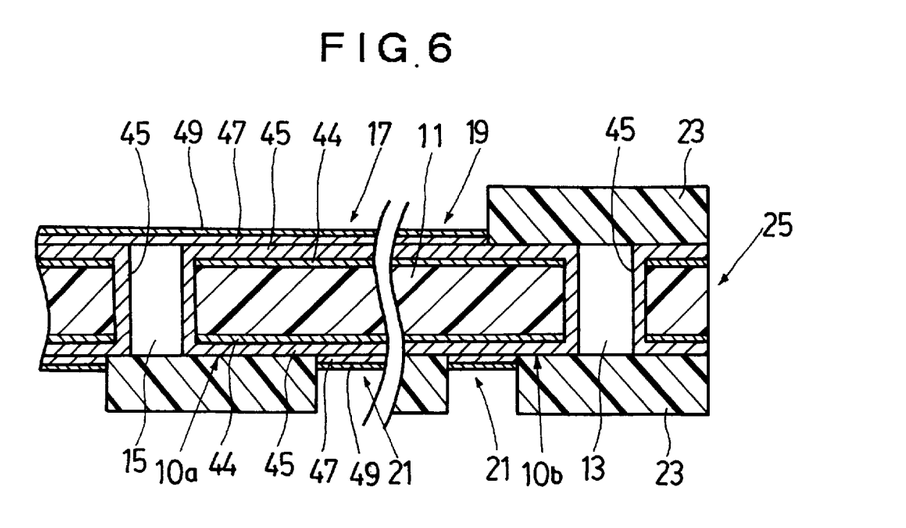
FIG. 6 is a sectional view of the circuit board for explaining a third process.

A method of fabricating the PBGA 1 is next described. A method of fabricating a circuit board of the PBGA 1 is first described with reference to FIGS. 4 to 6. FIGS. 4 to 6 are sectional views showing major portion of the circuit board 25 in each fabricating process, wherein the major portion is broken.

The resin substrate 11 is first prepared for fabricating the circuit board 25. The resin substrate 11 in the order of 0.2 to 0.4 mm in thickness is used in this embodiment and is made of Bismaleimide Triazine Resin which is square, and has a copper foil in the order of 18 $\mu$m in thickness which is stuck to the front and back surfaces thereof.

The resin substrate 11 is subjected to a drilling process at the central portion and a predetermined position close to the peripheral portion thereof using a cutting drill so as to form four through-holes 15 and forty through-holes 13. In FIGS. 4 to 6, the through-holes 15 and the through-holes 13 are respectively illustrated one by one.

Subsequently, the surface of the resin substrate 11 including the inner wall surfaces of the through-holes 15 and the through-holes 13 are cleaned, then the entire surface of the resin substrate 11 is subjected to copper electroless plating process and copper electroplating process, thereby forming a copper-plated layer 45 in the order of 12 to 22 $\mu$m in thickness as shown in FIG. 4. The copper-plated layer 45 is continuously formed from the entire surface of a copper foil 44 on the front and back surfaces of the resin substrate 11 to the inner wall surfaces of the through-holes 15 and through-holes 13.

Then, a photosensitive dry film (not shown) is stuck to both the upper and lower surfaces of the resin substrate 11 on which the copper-plated layer 45 is formed, and it is exposed and developed using a required photomask, thereby forming an etching resist film.

Thereafter, copper dichloride which is a general etching liquid is sprayed onto the front and back surfaces of the resin substrate 11, thereby removing the exposed copper-plated layer 45 which is not covered with the etching resist film as well as the copper foil 44.

With this process, the remaining part on the copper-plated layer 45 forms the die pattern 17 and each connection electrode 19 on the front surface of the resin substrate 11 as shown in FIG. 2, while the same forms the common wiring pattern 10c and the individual wiring patterns 10b on the back surface of the resin substrate 11. Further, the thus formed die pattern 17 and the common wiring pattern 10c are connected with each other by way of the copper-plated layer 45 formed on the inner wall surfaces of the through-holes 15 while each connection electrode 19 and each individual wiring pattern 10b are connected with each other by way of the copper-plated layer 45 formed on the inner wall surfaces of the through-holes 13.

Then, both the front and back surfaces of the resin substrate 11 on which each pattern and each connection electrode are formed are subjected to a laminating treatment using a plating resist. Then, they are exposed and developed using a required photomask so as to remove plating resist at the die pattern 17 and the connection terminal portions of the connection electrodes 19 formed on the front surface of the resin substrate 11 and the plating resist at the common wiring pattern 10c and the portion forming the pad electrodes 21 of each individual wiring pattern 10b formed on the back surface of the resin substrate 11, thereby defining openings to form a pattern of protecting resist 23 as shown in FIG. 5.

A nickel-plated layer 47 and a gold-plated layer 49 are formed as follows on the portion which is not covered with the protecting resist 23, namely, on the die pattern 17, on the connection terminal portions of the connection electrode 19 and the portion forming the pad electrodes 21.

That is, the nickel-plated layer 47 in the order of 5 to 15 μm in thickness is formed on the copper-plated layer 45, and a gold-plated layer 49 in the order of 0.3 μm to 0.7 μm in thickness is formed on the surface of the nickel-plated layer 47. The gold-plated layer 49 is formed for enhancing electric connecting condition while the nickel-plated layer 47 is formed for avoiding degradation of characteristic caused by chemical change between the gold-plated layer 49 and the copper-plated layer 45.

After fabricating the circuit board 25 in the manner set forth above, the conductive adhesive 27 is coated on the region where the die pattern 17 is formed, then the semiconductor chip 29 is placed on the adhesive 27, and the adhesive 27 is dried until it is completely cured. As a result, the semiconductor chip 29 is fixed onto the circuit board 25.

Then, each electrode of the semiconductor chip 29 and each connection electrode 19 provided on the circuit board 25 are connected with each other by the bonding wire 31. In this process, a ball bonding method is employed. That is, a ball is formed in advance on the tip end of each bonding wire 31 when each bonding wire 31 is subjected to an electric discharge processing, then the ball is crushed so that one end of each bonding wire is pressed against the electrode of the semiconductor chip 29 and the other end of each bonding wire is pressed against the gold-plated layers 49 formed on the surface of the connection terminal portion 19a of each connection electrode 19 (see FIG. 2), whereby the semiconductor chip 29 and the circuit board 25 are electrically connected with each other.

The semiconductor chip 29 and the bonding wires 31 are sealed by the sealing resin 33 in the following manner. That is, they are sealed and formed by a transfer mold wherein the sealing resin is inserted into a mold and a plunger applies pressure and heating to the sealing resin so that the fused sealing resin is supplied to a required portion of the mold through a runner.

Subsequently, the solder bumps 35 are provided on the back surface of the circuit board 25 in the following manner.

Each pad electrode 21 on the back surface of the circuit board 25 is first coated with a flux liquid to enhance (adhesion) of a solder, and each solder ball in the order of 0.6 to 0.8 mm in thickness is supplied to each pad electrode 21. Then, each solder ball is heated to a temperature of about 220 to 230° C. in a heating furnace so that each solder ball is joined with each pad electrode 21 to provide the solder bumps 35. The flux liquid used in this process is a rosin system material, and a solder consisting of tin and lead at a mixture ratio of 6 to 4 is used as the solder balls.

Finally, the back surface of the circuit board 25 is cleaned using alcohol system cleaner and the flux liquid remained on the back surface of the circuit board 25 is removed, thereby completing the PBGA 1.

Figure 7:
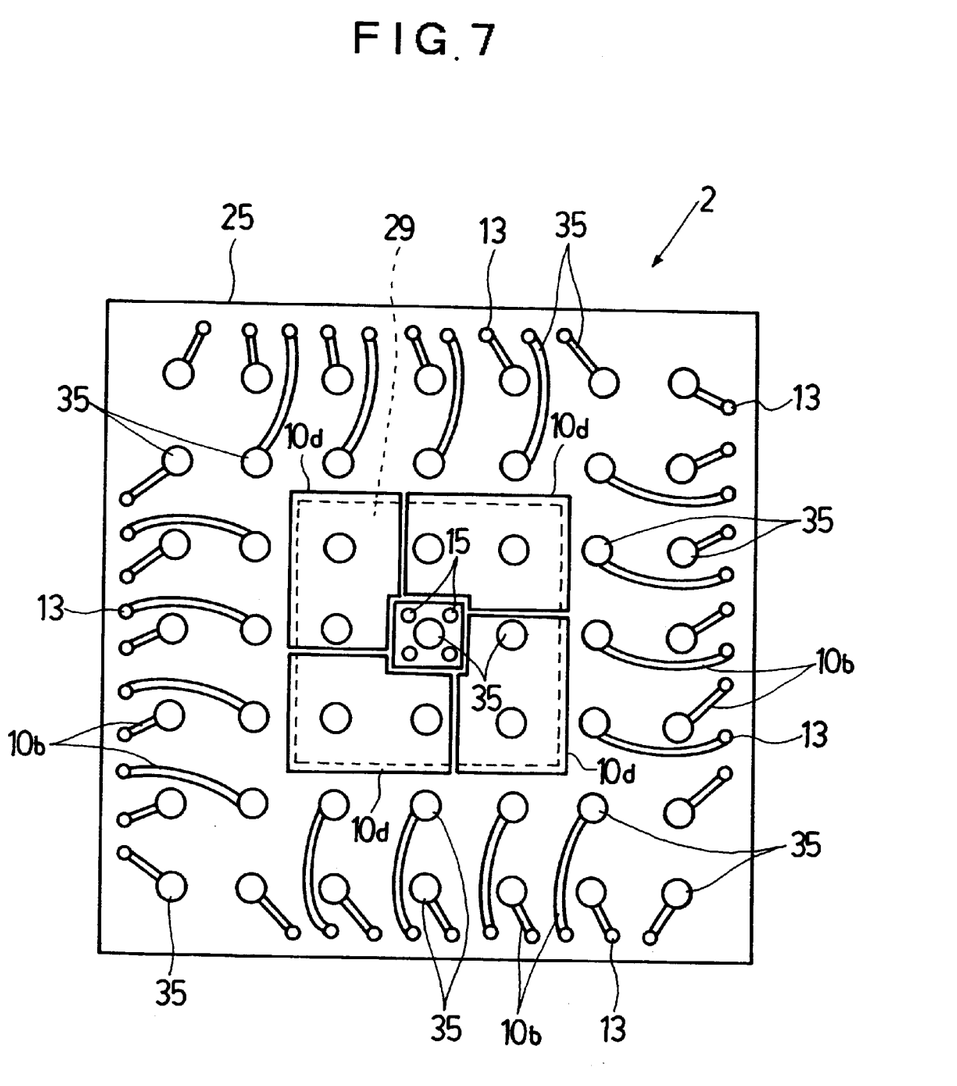
FIG. 7 is a rear view of a semiconductor device like FIG. 3 according to a second embodiment of the invention.

Then, a PBGA shown in FIG. 7 is explained as another embodiment of the invention. FIG. 7 is a rear view of a PBGA 2 like FIG. 3, and components which are the same as those in FIG. 3 are depicted by the same reference numerals.

Comparing the PBGA 2 with the PBGA 1, the component of a wiring pattern of the PBGA 2 at the portion facing the semiconductor chip is different from that of the PBGA 1, but other component of the PBGA 2 is the same as those of the PBGA 1, and hence the explanation there of is omitted.

The wiring pattern formed on the back surface of a circuit board 25 at the central portion facing a semiconductor chip 29 is divided into a square pattern 10e including one solder bump 35 at the central portion and four through-holes 15 and substantially rectangular four patterns 10d each having two solder bumps 35 so as to surround the square pattern 10e. Since each of the wiring patterns 10d and 10e is electrically insulated from each other while small gaps are defined therebetween, each of the wiring patterns 10d and 10e not only becomes ground electrodes but also can transmit different voltages or signals individually therethrough.

Each of the wiring patterns 10d, 10e is provided on the back surface of the circuit board 25 and formed on substantially the entire surface of a predetermined region which is larger than the outer dimensions of the semiconductor chip 29 and extends to the entire periphery thereof.

Accordingly, the PBGA 2 can effectively prevent moisture from permeating the back surface of the semiconductor chip 29 and the peripheral surface thereof through the back surface of the circuit board 25 like the PBGA 1, so that water can be prevented from building up in the portion close to the die pattern 17, and the semiconductor chip 29 is prevented from exfoliating from the die pattern 17, and bonding wire bonding wires 31 are not cut even if the PBGA 2 is heated when it is mounted on the mother board, thereby enhancing a reliability of the semiconductor device.

Since the wiring patterns 10d, 10e at the portion facing the semiconductor chip 29 of the PBGA 2 are different from the common wiring pattern 10c of the PBGA 1 in that the wiring patterns 10d, 10e have small gaps therebetween, small amount of moisture can permeate the back surface of the semiconductor chip 29 but it is possible to prevent moisture from permeating the peripheral portion of the semiconductor chip 29 with assurance.

As mentioned above, according to the semiconductor device of the invention, the wiring pattern on the back surface of the circuit board facing the semiconductor chip is formed on the entire surface of a predetermined region which is larger than the outer dimensions of the semiconductor chip and which extends to the entire periphery thereof, it is possible to effectively prevent moisture from permeating the back surface of the circuit board circuit board 25 at a portion corresponding to the semiconductor chip and the periphery thereof by the wiring pattern.

Accordingly, water is not built up in the portion close to the die pattern 17, vaporization and expansion of the water which produces stress does not occur by heating when mounting the semiconductor chip, and the semiconductor chip is not exfoliated from the die pattern and the bonding wires are not cut owing to the stress, thereby enhancing a reliability of the semiconductor device.

What is claimed is:

1. A semiconductor device including a semiconductor chip which is mounted on a circuit board by an adhesive and sealed by a resin comprising:

a die pattern for mounting the semiconductor chip thereon using the adhesive, and a plurality of connection electrodes connected with each electrode of the semiconductor chip by bonding wires, said die pattern and connection electrodes being provided on one surface of the circuit board;

a wiring pattern electrically connected with the die pattern or the connection electrodes by way of through-holes, a plurality of pad electrodes provided on the wiring pattern, and a plurality of solder bumps electrically connected with the wiring pattern by way of the pad electrodes, said wiring pattern, pad electrodes and solder bumps being provided on the other surface of the circuit board;

wherein a portion of the wiring pattern facing the back surface of the semiconductor chip is formed on substantially an entire surface of a predetermined region which is larger than the outer dimensions of the semiconductor chip and extends to the entire periphery of the semiconductor chip.

2. The semiconductor device according to claim 1, wherein the portion of the wiring pattern facing the back surface of the semiconductor chip is divided into a plurality of portions which are electrically insulated from one another by small gaps.

* * * * *